(12) United States Patent
Davis et al.

(10) Patent No.: US 7,850,040 B2
(45) Date of Patent: Dec. 14, 2010

(54) COMPONENT TAPE FEEDER

(75) Inventors: Peter Davis, Santa Cruz, CA (US); Dean Tarrant, San Jose, CA (US); Michael Summers, Santa Cruz, CA (US)

(73) Assignee: Hover-Davis, Inc., Rochester, NY (US)

( * ) Notice: Subject to any disclaimer, the term of this patent is extended or adjusted under 35 U.S.C. 154(b) by 966 days.

(21) Appl. No.: 11/551,934

(22) Filed: Oct. 23, 2006

(65) Prior Publication Data
US 2008/0093375 A1    Apr. 24, 2008

(51) Int. Cl.
B65H 5/28 (2006.01)
G07F 11/68 (2006.01)
B65H 20/00 (2006.01)
B65H 23/00 (2006.01)
B65H 57/18 (2006.01)

(52) U.S. Cl. .................. 221/72; 226/188; 226/110; 226/128; 226/80; 226/139; 226/132; 242/566; 242/564.4; 242/564.3; 414/416

(58) Field of Classification Search .......... 414/416; 221/72; 226/188, 110, 128, 80, 139, 62, 226/132; 156/584; 242/564.4, 564.3, 566
See application file for complete search history.

(56) References Cited

U.S. PATENT DOCUMENTS

| | | | | |
|---|---|---|---|---|
| 4,432,481 A | * | 2/1984 | Miller | 226/9 |
| 5,299,902 A | * | 4/1994 | Fujiwara et al. | 414/416.01 |
| 5,515,600 A | * | 5/1996 | Iwasaki et al. | 29/740 |
| 5,562,384 A | * | 10/1996 | Alvite et al. | 414/226.01 |
| 5,725,140 A | * | 3/1998 | Weber et al. | 226/139 |
| 6,162,007 A | * | 12/2000 | Witte | 414/416.01 |
| 6,368,045 B1 | | 4/2002 | Ashman et al. | |
| 6,592,217 B2 | * | 7/2003 | Tanaami | 347/104 |
| 6,705,376 B2 | * | 3/2004 | Van Der Rijst | 156/584 |
| 6,857,546 B2 | | 2/2005 | Saho | |
| 6,879,869 B2 | | 4/2005 | Kou | |
| 6,887,330 B2 | * | 5/2005 | Onoshiro et al. | 156/159 |
| 6,948,541 B2 | * | 9/2005 | Bergstrom et al. | 156/584 |
| 7,464,741 B2 | * | 12/2008 | Kawaguchi et al. | 156/584 |

* cited by examiner

*Primary Examiner*—Gene Crawford
*Assistant Examiner*—Rakesh Kumar
(74) *Attorney, Agent, or Firm*—Schneiser, Olsen & Watts, LLP

(57) ABSTRACT

Provided is a component tape feeder apparatus comprising a single output module, a single component exposure module, operably connected to the single output module, and, a plurality of input modules, wherein each input module of the plurality of input modules is operably connected to the single exposure module. A corresponding method of feeding electronic components includes supplying a plurality of component tapes housing electronic components to the single exposure module, wherein the supplying involves receiving and forwarding of the plurality of component tapes by the plurality of input modules.

6 Claims, 16 Drawing Sheets

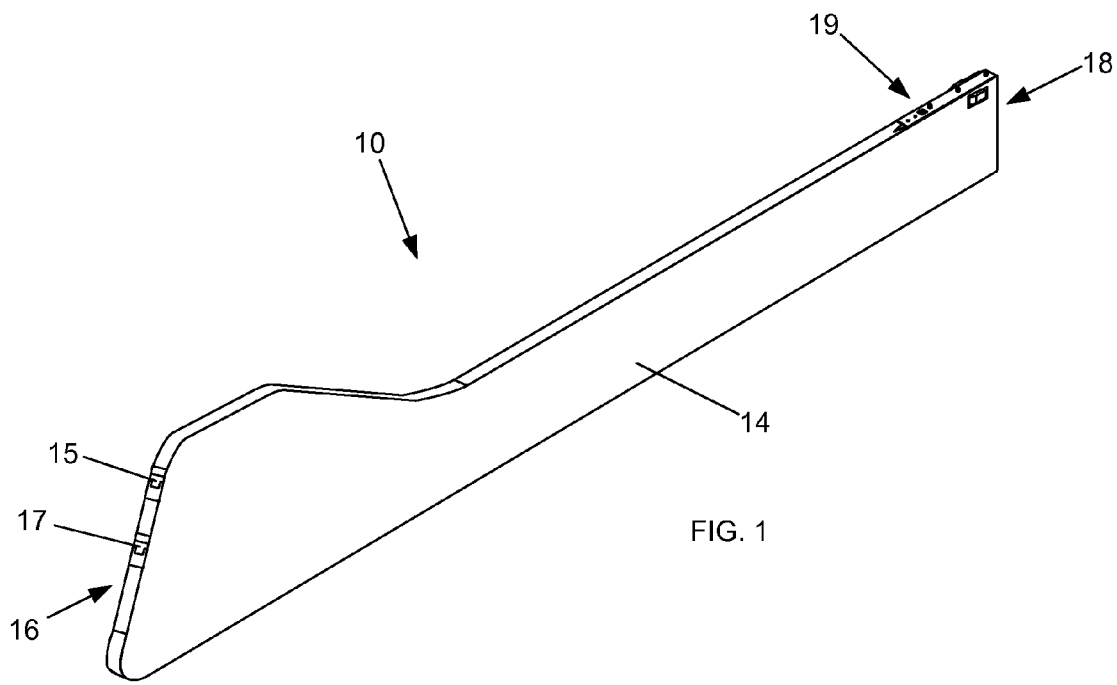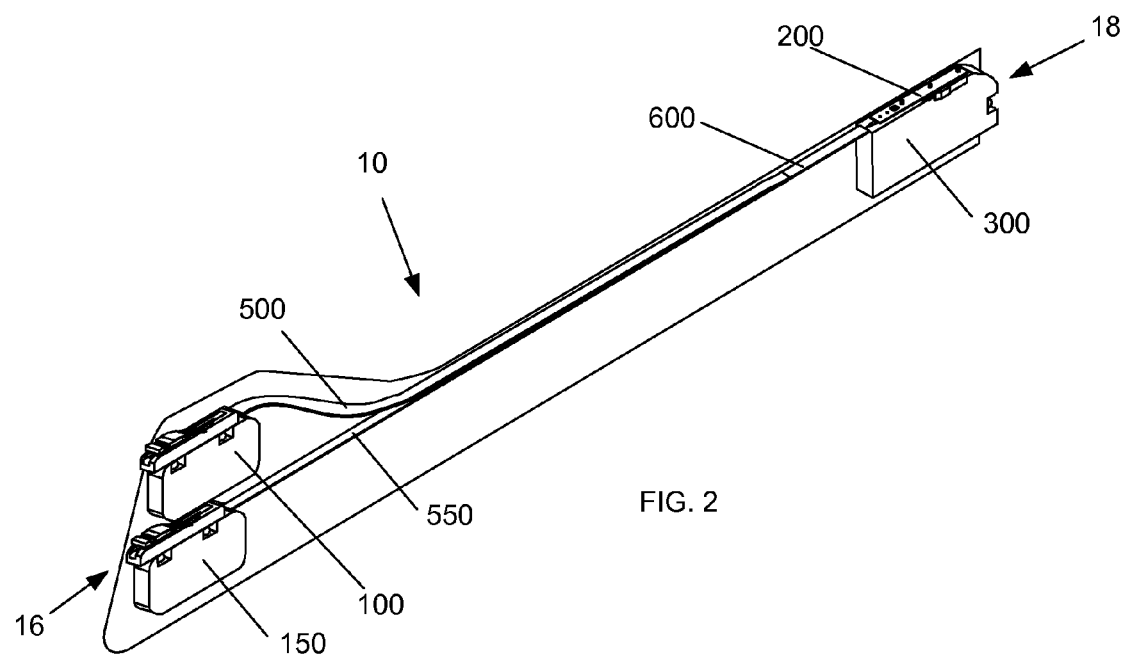

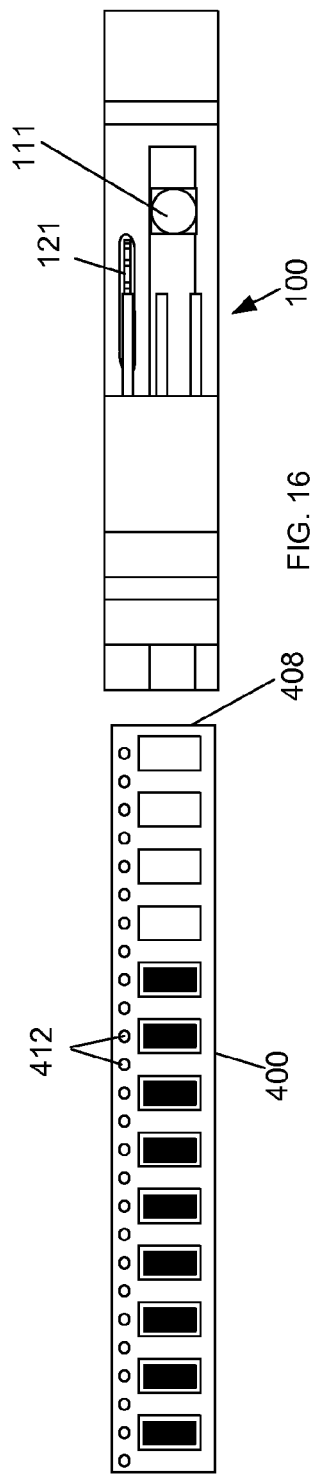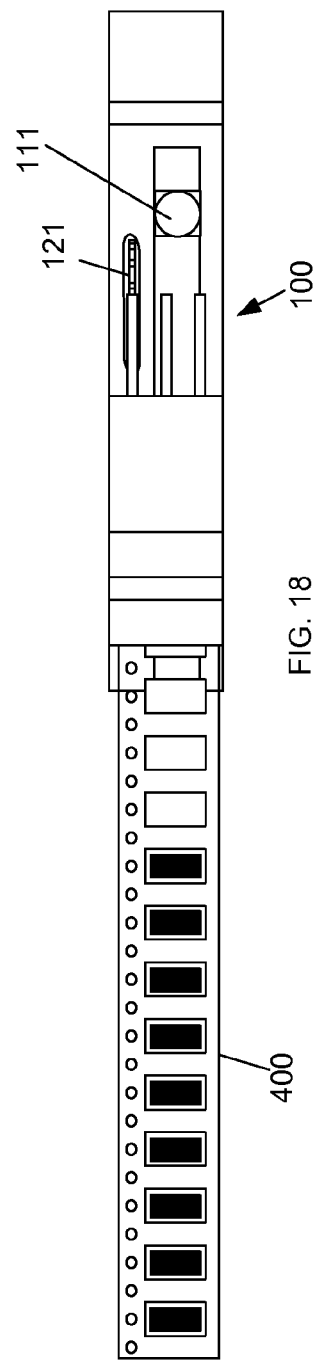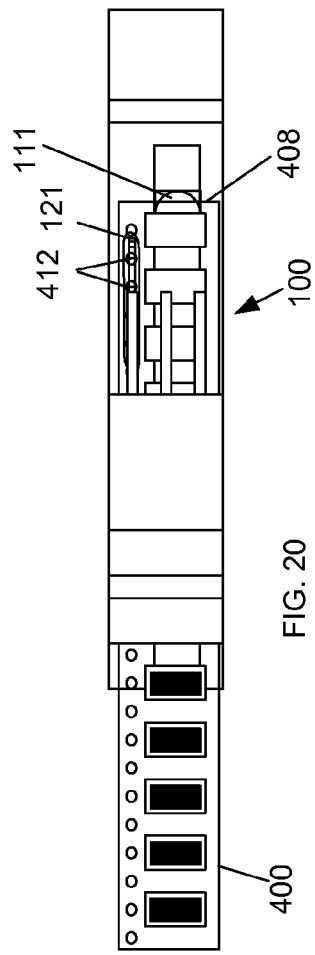

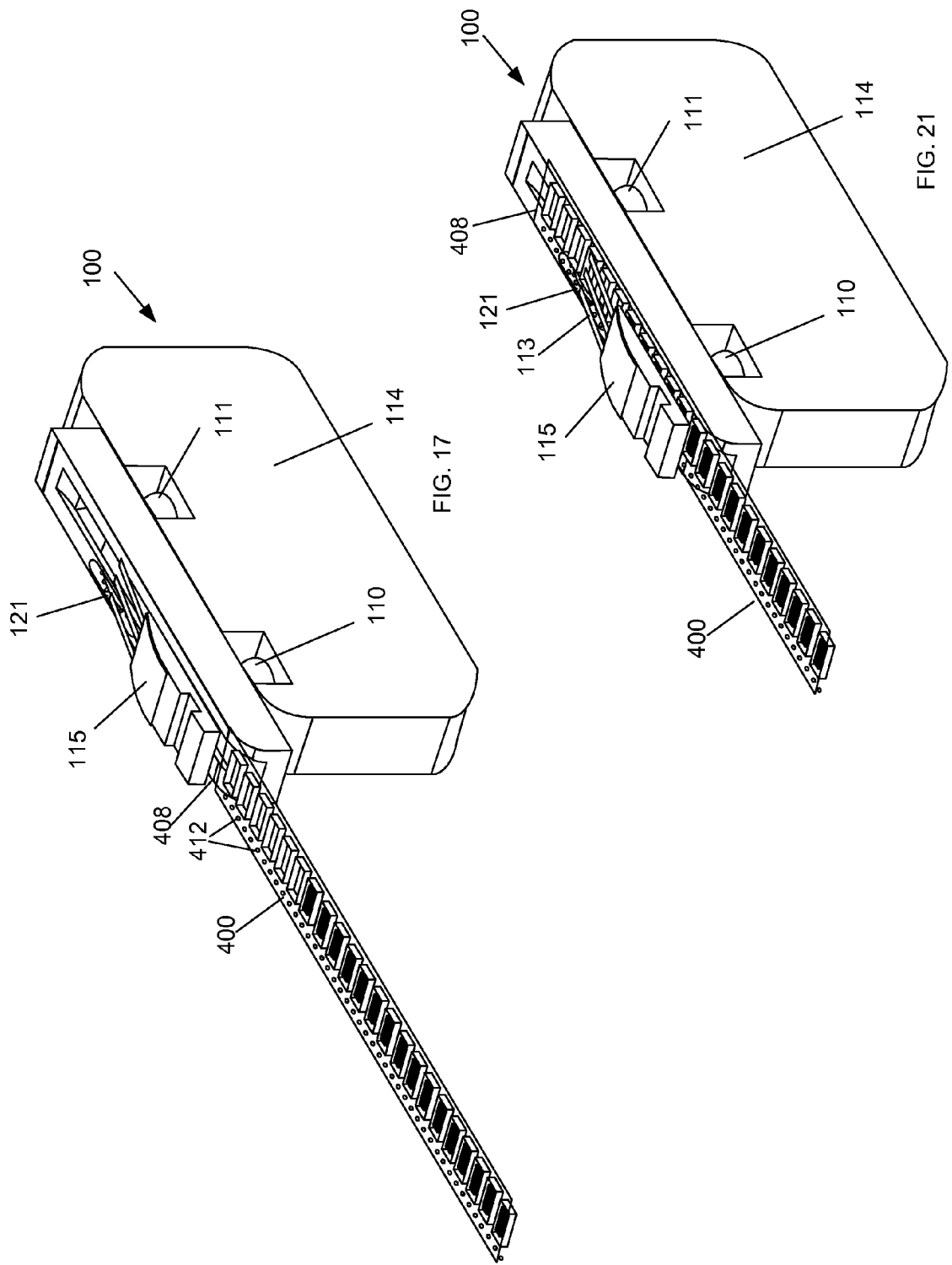

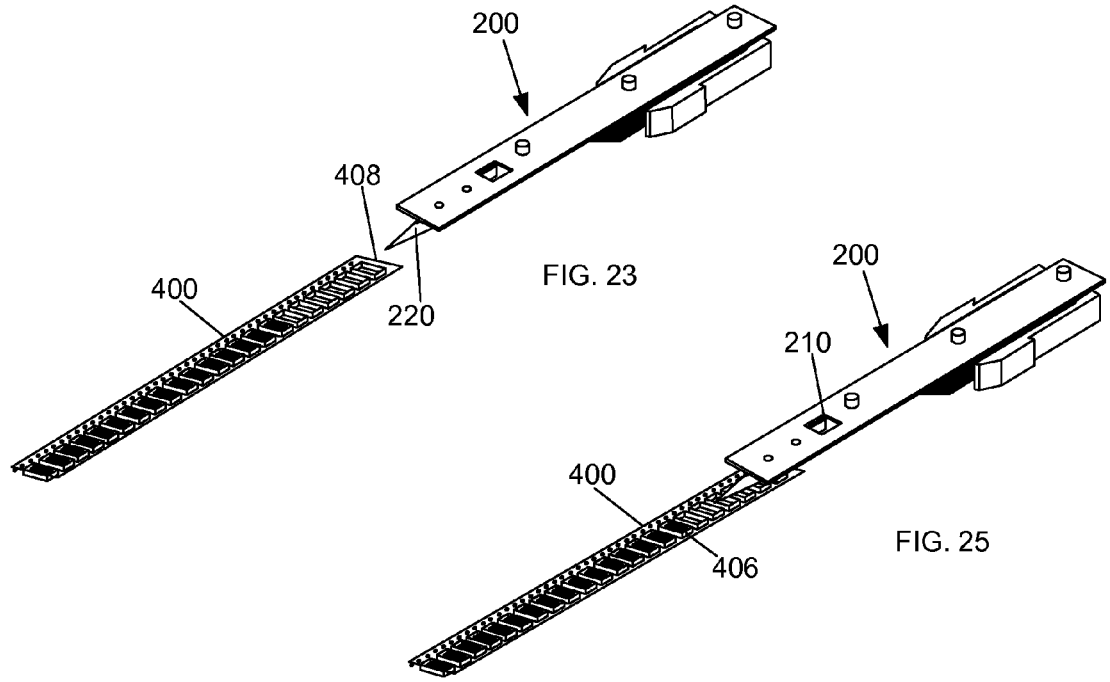
FIG. 23
FIG. 25
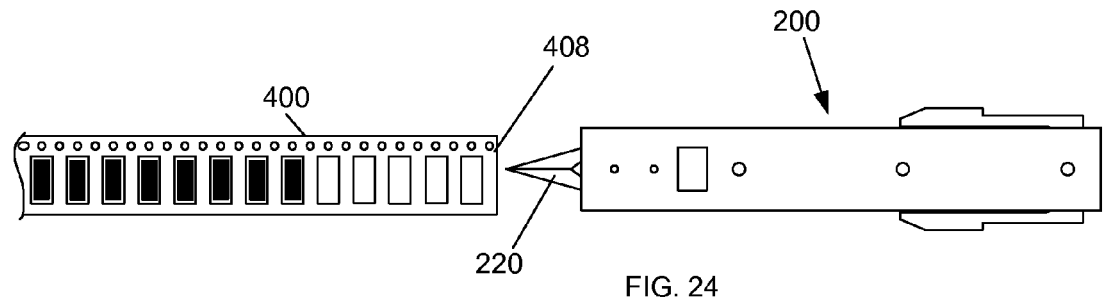
FIG. 24
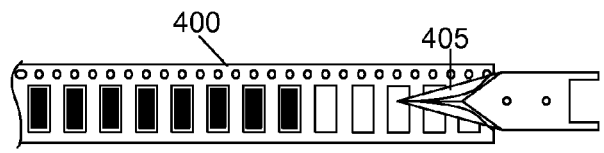
FIG. 26
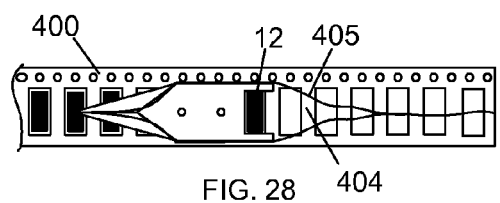
FIG. 28

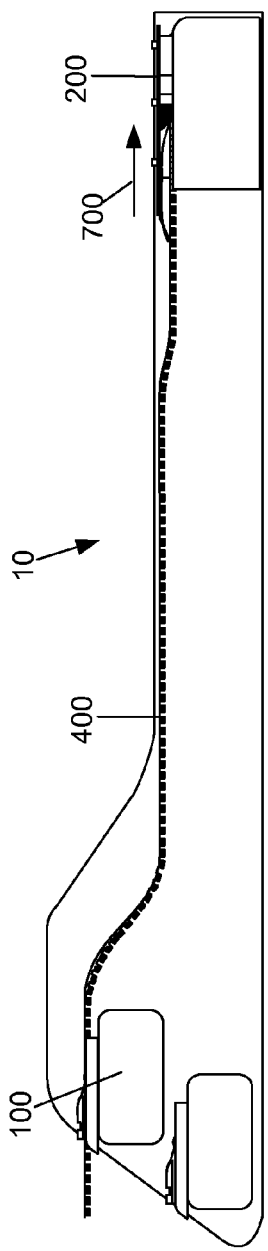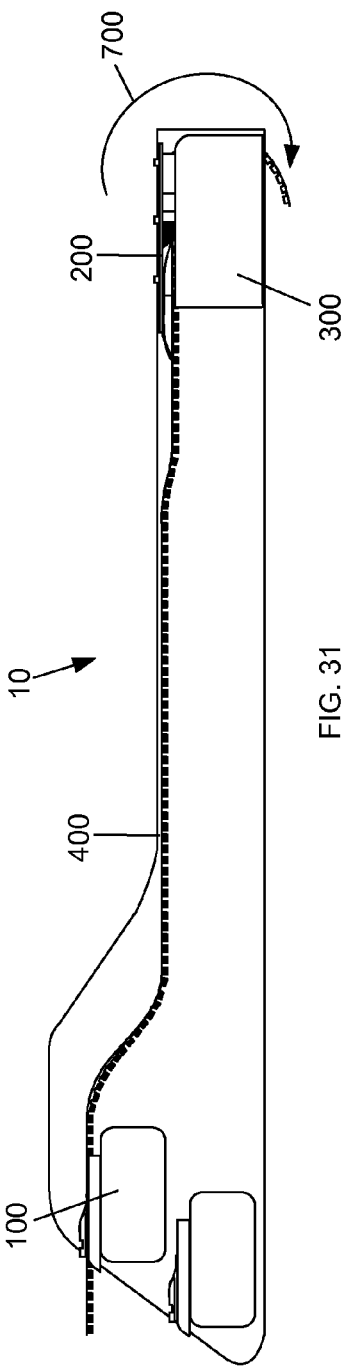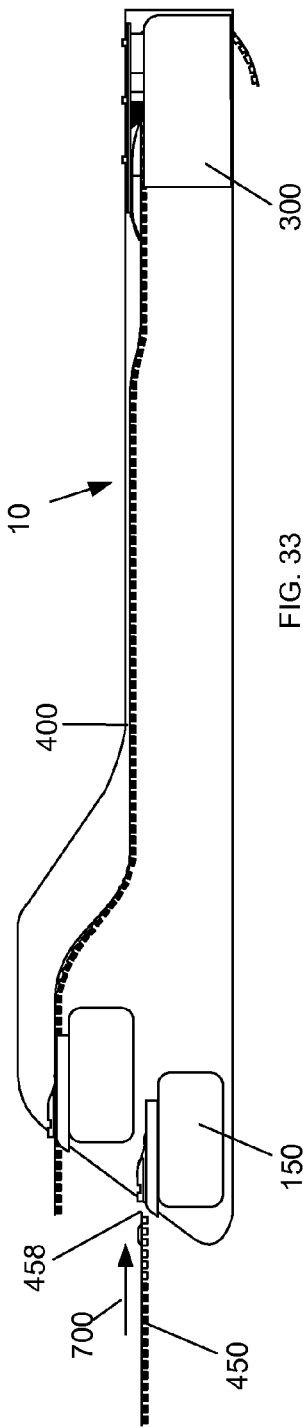

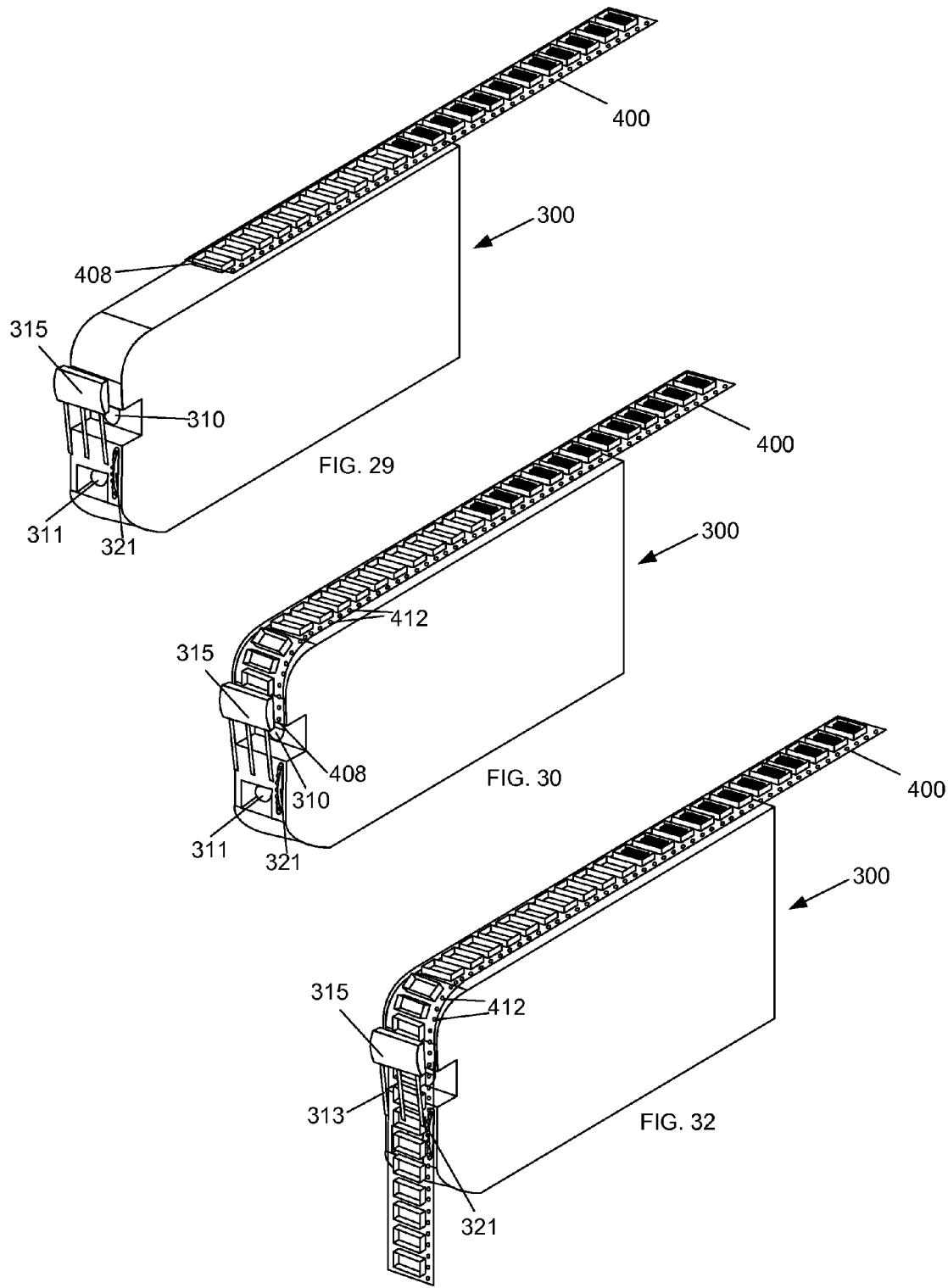

COMPONENT TAPE FEEDER

BACKGROUND OF THE INVENTION

1. Technical Field

This invention relates generally to a component feeder apparatus. More particularly, this invention provides a device for feeding electronic components supplied in multiple component tapes to a component placement machine and the manner in which the components are supplied.

2. Related Art

Electronic devices commonly include printed circuit boards comprising several electronic components. Such electronic components are frequently assembled onto a printed circuit board by a component placement machine. Electronic components to be picked and placed by a component placement machine for assembly onto a printed circuit board are typically supplied via a component tape. The component tape may comprise a base tape, which may further comprise pockets for housing the components, and a cover tape to retain the components within the pockets. The component tape is usually made of paper or plastic and the plastic, which may be embossed, may either be clear or embossed. Ordinarily, the component tape is wound onto reels which are attached to a feeder which in turn is mounted within a component placement machine. The feeder generally operates by feeding the component tape through a series of mechanisms such that the cover tape is separated from the base tape to expose the component housed within the pocket. When a feeder is mounted in a proper position within a component placement machine, a component may be picked from the component tape at a corresponding pick position or pick point. Accordingly the component placement machine is able to pick the exposed component from the component tape supplied by the feeder and then place the component onto a printed circuit board which has been supplied to the component placement machine for assembly. Typical feeders comprise means for supplying only a single component tape to the pick point within the component placement machine. Thus, typical feeders become dedicated to a particular component type. In addition, standard feeders are typically designed so that when the component tape is depleted of components an operator must either splice a new component tape to the existing component tape, or remove the feeder to load a new component tape. This limits the number of types of components that may be supplied by the feeder and increases the difficulty and time necessary for supplying additional component tapes to the same pick point. Therefore, there exists a need for an improved feeder which overcomes the aforementioned deficiencies.

SUMMARY OF THE INVENTION

A first aspect of the present invention provides a component tape feeder comprising: at least two input modules, each input module configured to receive and advance a separate component tape; a single component exposure module, positioned within said component tape feeder to reveal a component housed within a said separate component tape received and advanced by any of said at least two input modules; and a single output module, configured to remove said received and advanced component tape from said feeder.

A second aspect of the present invention provides a component tape feeder apparatus comprising: a single output module; a single component exposure module, operably connected to said single output module; and, a plurality of input modules, wherein each input module of said plurality of input modules is operably connected to said single component exposure module.

A third aspect of the present invention provides a method of feeding electronic components, said method comprising: providing a component tape feeder, said feeder including a plurality of input modules, wherein each input module of said plurality of input modules is operably connected to a single component exposure module, and further wherein said single component exposure module is operably connected to a single output module; supplying a plurality of component tapes housing electronic components to said single exposure module, wherein said supplying involves receiving and forwarding of said plurality of component tapes by said plurality of input modules; extracting said electronic components housed by said plurality of component tapes through said single exposure module; and, outputting said plurality of component tapes from said component tape feeder by a single output module.

BRIEF DESCRIPTION OF THE DRAWINGS

Some embodiments of this invention will be described in detail, with reference to the following figures, wherein like designations denote like members, wherein:

FIG. 1 depicts a perspective view of an embodiment of a component tape feeder apparatus, in accordance with embodiments of the present invention;

FIG. 2 depicts a perspective view of an embodiment of a component tape feeder apparatus having a cover removed, in accordance with embodiments of the present invention;

FIG. 16 depicts a top view of an embodiment of the first component tape just prior to initial insertion into an embodiment of the first input module, in accordance with embodiments of the present invention;

FIG. 17 depicts a perspective view of an embodiment of the first component tape being initially inserted into an embodiment of the first input module, in accordance with embodiments of the present invention;

FIG. 18 depicts a top view of an embodiment of the first component tape being initially inserted into an embodiment of the first input module, in accordance with embodiments of the present invention;

FIG. 20 depicts a top view of an embodiment of the first component tape following initial insertion into an embodiment of the first input module, in accordance with embodiments of the present invention;

FIG. 21 depicts a perspective view of an embodiment of the first component tape following initial insertion into an embodiment of the first input module, in accordance with embodiments of the present invention;

FIG. 23 depicts a perspective view of an embodiment of the first component tape just prior to encounter with an embodiment of an exposure module, in accordance with embodiments of the present invention;

FIG. 24 depicts a top view of an embodiment of the first component tape just prior to encounter with an embodiment of an exposure module, in accordance with embodiments of the present invention;

FIG. 25 depicts a perspective view of an embodiment of the first component tape just after encounter with an embodiment of an exposure module, in accordance with embodiments of the present invention;

FIG. 26 depicts a top view of an embodiment of the first component tape just after encounter with an embodiment of tape engagement element of an embodiment of an exposure module, in accordance with embodiments of the present invention;

FIG. 27 depicts a side view of an embodiment of the first component tape following encounter with an embodiment of an exposure module of an embodiment of a component tape feeder apparatus having a cover removed, in accordance with embodiments of the present invention;

FIG. 28 depicts a top view of an embodiment of the first component tape following encounter with an embodiment of tape engagement element of an embodiment of an exposure module, in accordance with embodiments of the present invention;

FIG. 29 depicts a perspective view of an embodiment of the first component tape initially encountering an embodiment of an output module, in accordance with embodiments of the present invention;

FIG. 30 depicts a perspective view of an embodiment of the first component tape encountering an embodiment of an output module, in accordance with embodiments of the present invention;

FIG. 31 depicts a side view of an embodiment of the first component tape being outputted following encounter with an embodiment of an output module of an embodiment of a component tape feeder apparatus having a cover removed, in accordance with embodiments of the present invention;

FIG. 32 depicts a perspective view of an embodiment of the first component tape being outputted following encounter with an embodiment of an output module, in accordance with embodiments of the present invention;

FIG. 33 depicts a side view of an embodiment of the first component tape being fed through an embodiment of a component tape feeder apparatus and outputted by an embodiment of an output module and also of an embodiment of a second component tape just prior to initial insertion into an embodiment of a second input module of the component tape feeder apparatus having a cover removed, in accordance with embodiments of the present invention;

DETAILED DESCRIPTION OF THE INVENTION

Figure 3:
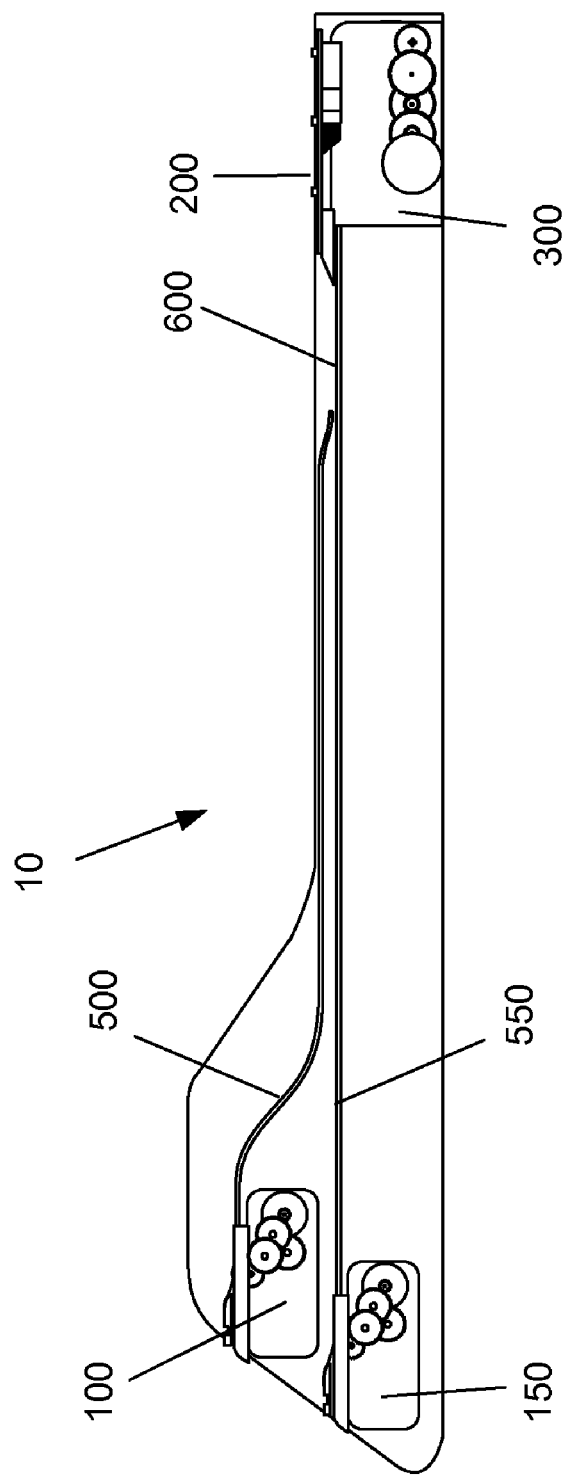
FIG. 3 depicts a side view of an embodiment of a component tape feeder apparatus having a cover removed, in accordance with embodiments of the present invention.

Although certain embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc. and are disclosed simply as an example of an embodiment. The features and advantages of the present invention are illustrated in detail in the accompanying drawings, wherein like reference numerals refer to like elements throughout the drawings.

As a preface to the detailed description, it should be noted that, as used in this specification and the appended claims, the singular forms "a", "an" and "the" include plural referents, unless the context clearly dictates otherwise.

Figure 50:
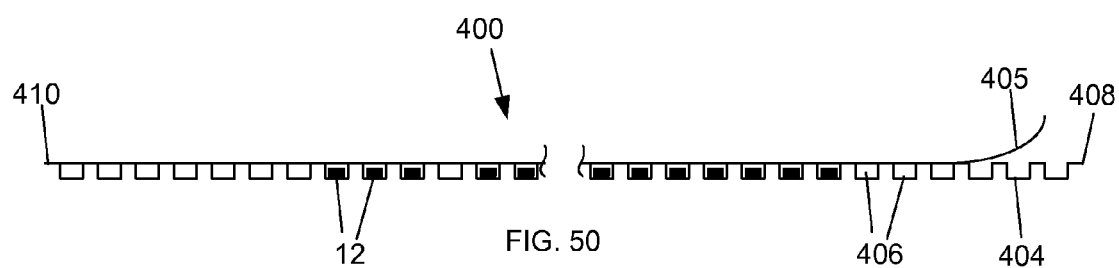
FIG. 50 depicts a side view of an embodiment of a component tape, in accordance with embodiments of the present invention.
Figure 51:
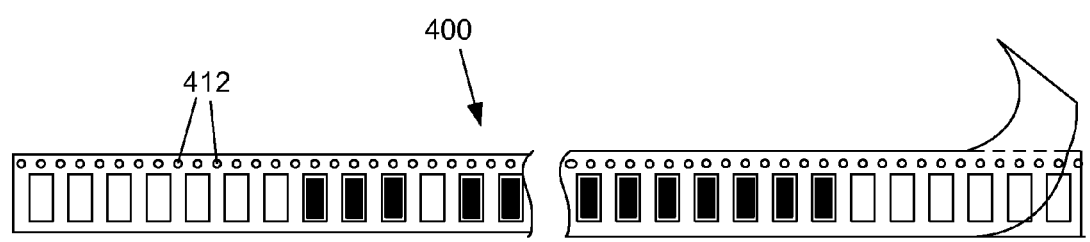
FIG. 51 depicts a top view of an embodiment of a component tape, in accordance with embodiments of the present invention.

Turning now to the drawings, FIG. 1 depicts a perspective view of an embodiment of a component tape feeder apparatus 10, in accordance with embodiments of the present invention. The feeder apparatus 10 may be used for feeding and supplying electronic components 12, contained within a component tape 400 (shown in FIGS. 50-51), to a component placement machine (not shown). Component tape 400 may comprise a cover tape 405, a base tape 404, and a plurality of pockets 406 which house electronic components 12. Component tape 400 may also include a leading edge 408 and trailing edge 410 as well as holes 412. Holes 412 may be situated either on one or both sides of component tape 400 and are typically spaced equally apart. Base tape 404 may be clear or embossed plastic, paper, or blister type.

Referring further to FIG. 1, a component feeder apparatus 10 may include an external cover 14 or body that may service as a shell to enclose and protect internal components. Moreover, feeder apparatus 10 may include a first end 16 and opposing second end 18. Furthermore, embodiments of a feeder apparatus 10 may include a plurality of component tape inputs such as a first input 15 and a second input 17 through which a component tape, such as component tape 400 shown in FIGS. 50-51, may be inserted. Still further, a feeder apparatus 10 may include a component exposure portion 19, wherein components 12 of a component tape, such as tape 400, may be exposed for extraction from the feeder apparatus 10.

With continued reference to the drawings, FIGS. 2-3 depict a perspective and side view, respectively, of an embodiment of a component tape feeder apparatus 10 having a cover 14 removed. Hence, various internal components of the feeder 10 may be revealed to view. As revealed, the component feeder apparatus 10 may comprise a plurality of input modules, such as a first input module 100 and a second input module 150. The plurality of input modules, such as a first input module 100 and a second input module 150, may each be configured to receive and advance a separate component tape, such as component tape 400. Additionally, a component feeder apparatus 10 may comprise a single exposure module 200. Moreover, a component feeder apparatus 10 may also comprise and a single output module 300. The output module 300 may work in conjunction with any of the plurality of input modules, such as first and second input modules 100 and 150, to transport component tape 400 through feeder 10. Furthermore, the output module 300 may be configured to remove a component tape received and advanced from any of the plurality of input modules, such as input modules 100 and 150, from the component tape feeder apparatus 10. The plurality of input modules 100/150 may be located proximate the first end 16 of the feeder 10 while the output module 300 may be located proximate the second end of the feeder 10. However, those of ordinary skill should appreciate that the location of the input modules and output module may be anywhere within the feeder apparatus 10 so that the configuration of the feeder 10 facilitates feeding and supplying of electronic components 12 to a component placement machine (not shown). Supplying of an electronic component 12 may involve exposing the component 12, as positioned within a pocket 406 and maneuvering the exposed component 12 to a location accessible by the component placement machine for extraction from the pocket 406 and assembly onto a printed circuit board. The exposure module 200 may be positioned within the component tape feeder to reveal an electronic component 12 housed within a component tape, such as tape 400, received and forwarded by any of at least two input modules, such as input modules 100 and 150. Accordingly, an exposure module 200 may also be located so that components 12 exposed in relation to the exposure module 200 are positioned at a pick position or pick point corresponding to proper component placement machine geometry and functionality. The input modules 100 and 150, exposure module 200 and output module 300 may be swappable, replaceable component elements that may be readily exchanged for other comparable components with in a component tape feeder apparatus 10, in accordance with embodiments of the present invention.

Referring still further to FIGS. 2-3, a component tape feeder apparatus 10 may include a first channel 500 such as a conduit component or guide element that may facilitate controlled and directed movement of a component tape, such as component tape 400, from the first input module 100 further into and through the feeder apparatus 10. Moreover, a component tape feeder apparatus 10 may also include a second channel 550 such as a conduit component or guide element providing means to control and direct movement of a component tape, such as component tape 400, from the second input module 150 further into and through the feeder apparatus 10. The channels 500 and 550 may combine into a single channel 600. In addition, the channels 500, 550 and 600 may structurally tie the plurality of input modules 100/150 to the single exposure module 200 and facilitate the operable positioning and movement of a component tape, such as tape 400, between the input modules 100/150 and the exposure module 200. Nevertheless, where an embodiment of a feeder apparatus may not include channels or guides, the operable positioning and movement of a component tape itself between any of a plurality of input modules, such as input modules 100 and 150 and the exposure module 200 operably joins the input and exposure structures. Thus each input module, such as modules 100/150, of a plurality of input modules may be operably connected to the single component exposure module 200. In addition, the feeder 10 may be configured so that a component tape, such as tape 400, may be positioned and maneuvered between the exposure module 200 and the output module 300. Such positioning and maneuvering may be facilitated by guide features. Hence, the single exposure module 200 of a feeder apparatus 10 may be operably connected to the single output module 300.

Figure 4:
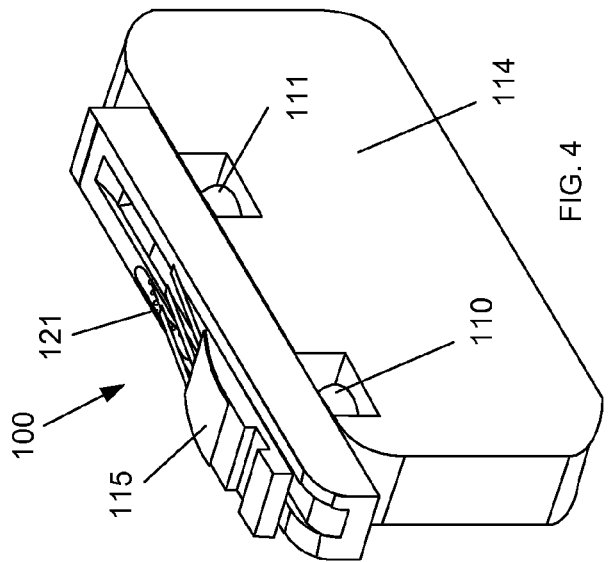
FIG. 4 depicts a perspective view of an embodiment of an input module, in accordance with embodiments of the present invention.
Figure 5:
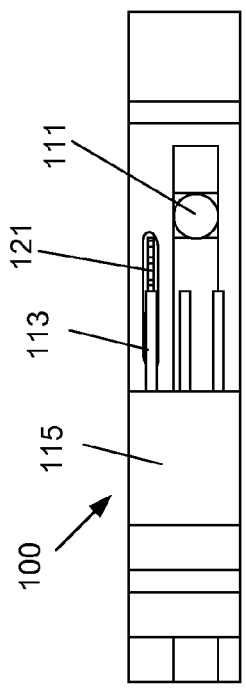
FIG. 5 depicts a top view of an embodiment of an input module, in accordance with embodiments of the present invention.
Figure 8:
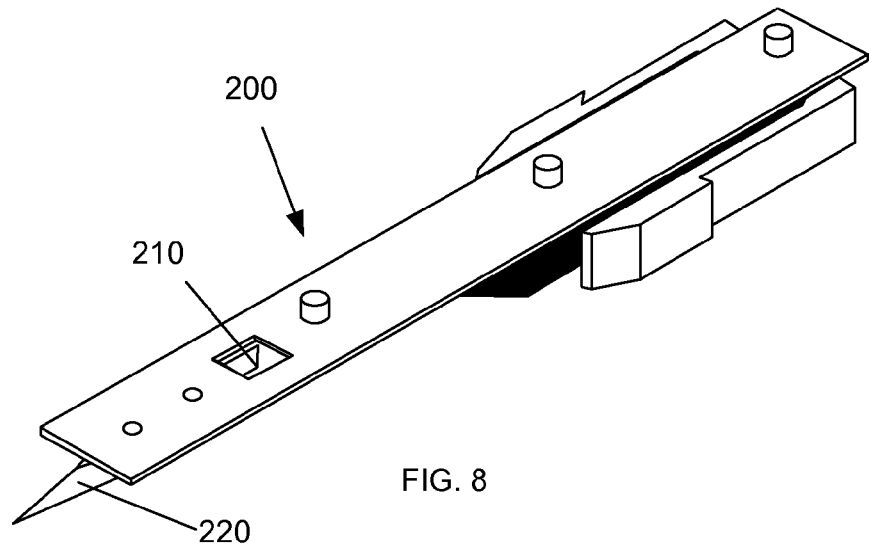
FIG. 8 depicts a perspective view of an embodiment of an exposure module, in accordance with embodiments of the present invention.
Figure 9:
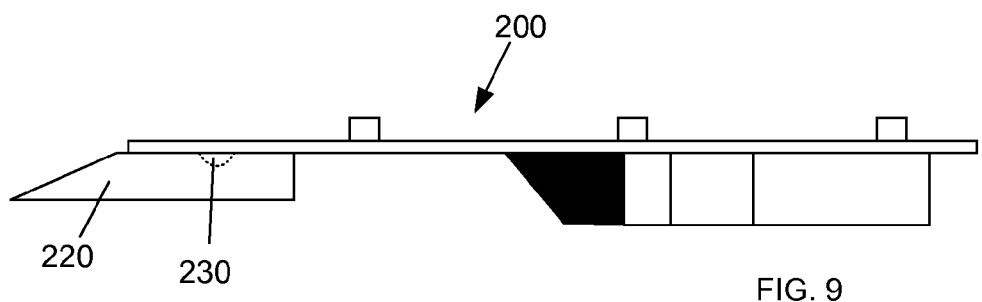
FIG. 9 depicts a side view of an embodiment of an exposure module, in accordance with embodiments of the present invention.
Figure 10:
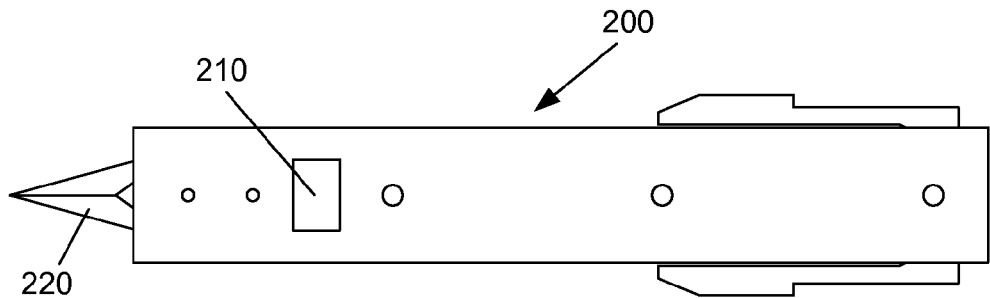
FIG. 10 depicts a top view of an embodiment of an exposure module, in accordance with embodiments of the present invention.

Turning further to the drawings, FIGS. 4-5 depict a perspective view and top view, respectively, of an embodiment of an input module 100, in accordance with embodiments of the present invention. The input module 100 may include a cover 114 providing a secure housing for internal components. Moreover, the input module 100 may include a tape sensor 110 positioned to detect the presence and or the capture of a component tape, such as tape 400. The tape sensor 110 may be operable with the input module 100. Furthermore, the input module 100 may comprise a tape guide unit 115 configured to assist the positioning of the tape through the input module 100. The guide unit may include or work in conjunction with prongs 113 designed to help hold a component tape in correct position with respect to the input module 100. Still further, the input module 100 may include a drive member 121. The drive member may be any structure operable to advance a component tape, such as tape 400, through an input module. For instance, the drive member 121 may be a gear like component having teeth configured to interact with holes 412 of a component tape 400 (shown in FIGS. 50-51). However, the drive member 121 may also be a roller like structure and may work in conjunction with another structural member to roll and advance a component tape 400. The input module 100 may be configured to receive and advance a component tape, such as tape 400. Furthermore, the input module 100 may be configured to receive and advance a component tape, such as tape 400 in either a forward or reverse direction.

Figure 6:
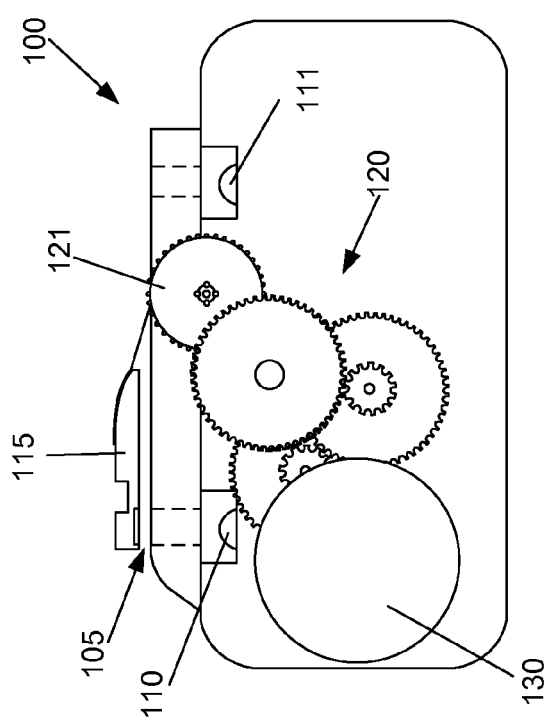
FIG. 6 depicts a side view of an embodiment of an input module having a portion of the cover cut-away to reveal internal components, in accordance with embodiments of the present invention.
Figure 7:
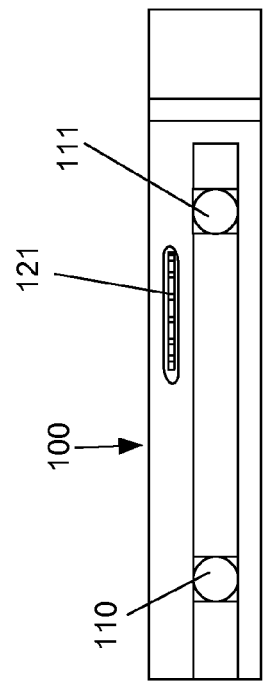
FIG. 7 depicts a top view of an embodiment of an input module having the guide unit removed, in accordance with embodiments of the present invention.

Additional component elements of an input module 100 are depicted in FIG. 6, which shows a side view of an embodiment of the input module 100 having a portion of the cover 114 cut-away to reveal internal components such as a drive system 120 and a motor 130. The drive system 120 may be an arrangement of gears configured to transfer motive force generated by a motor 130 to the drive member 121. As shown in FIG. 6, a tape slot 105 may be located and sized to securely accept an inserted component tape and may operate with the guide unit 115 to properly align the tape during advancement through the input module 100. The tape sensor 110 may be situated so as to be exposed to the presence of a component tape, such as tape 400. Tape sensor 110 may also detect the holes 412 in tape 400. Thus, as shown in FIG. 7, which depicts a top view of an embodiment of an input module 100 having the guide unit 115 removed, a tape sensor 110 may be oriented to readily detect the presence of a component tape during interaction with the input module 100. The tape sensor 110 may be communicatively coupled to various devices relative to component placement and printed circuit board assembly. Although only one drive member is shown, those in the art should realize that multiple drive members 121 may be included to help advance component tape.

Figure 11:
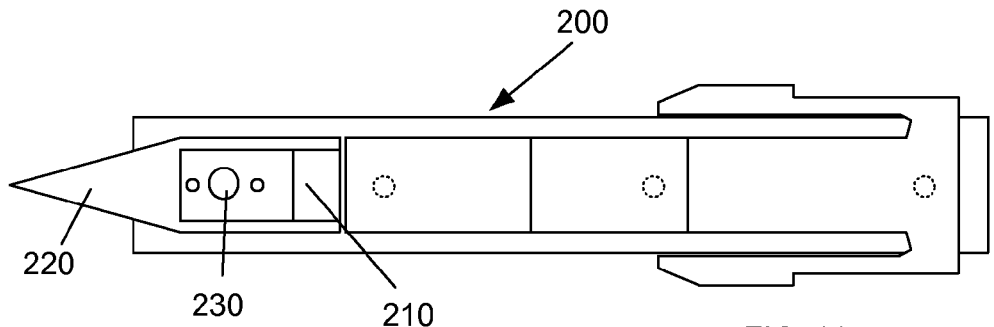
FIG. 11 depicts a bottom view of an embodiment of an exposure module, in accordance with embodiments of the present invention.

FIGS. 8-11 depict various views of an embodiment of an exposure module 200, in accordance with embodiments of the present invention. The exposure module may include a pick port 210. The pick port 210 may be sized and positioned for efficient extracting of electronic components, such as components 12, housed by any of a plurality of corresponding component tapes, such as a tape 400 (shown in FIGS. 50-51), through the single exposure module. Port 210 may be configurable to facilitate extraction of the smallest to the largest of electronic components 12, housable within a component tape 400 that may be feed through component tape feeder apparatus 10, or pick port 210 may be dedicated to either a particular size or range of sizes of component 12. Additionally, an exposure module 200 may include a tape engagement feature 220, which may facilitate exposure of electronic components 12 housed within a component tape 400. Exposure module 200 may also include a tape sensor 230 which may be situated so as to be exposed to the presence of a component tape, such as tape 400. Thus, as shown in FIG. 11, which depicts a bottom view of an embodiment of an exposure module 200, a tape sensor 230 may be oriented to readily detect the presence of a component tape during interaction with the exposure module 230. The tape sensor 230 may be communicatively coupled to various devices relative to component placement and printed circuit board assembly.

Figure 12:
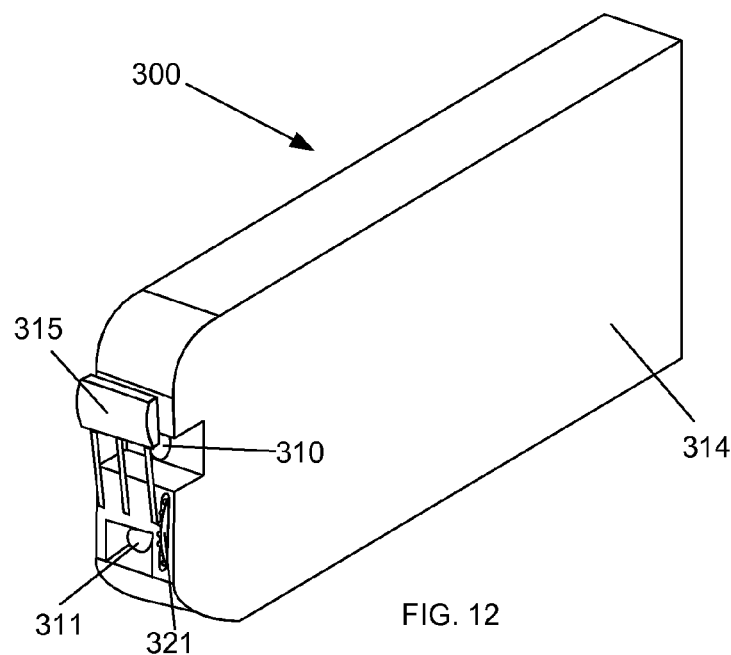
FIG. 12 depicts a perspective view of an embodiment of an output module, in accordance with embodiments of the present invention.
Figure 13:
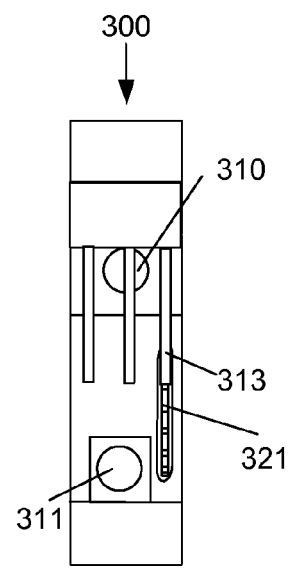
FIG. 13 depicts a front view of an embodiment of an output module, in accordance with embodiments of the present invention.

Referring further to the drawings, FIGS. 12-13 depict a perspective view and front view, respectively, of an embodiment of an output module 300, in accordance with embodiments of the present invention. The output module 300 may include a cover 314 providing a secure housing for internal components. Moreover, the output module 300 may include a tape sensor 310 positioned to detect the presence of a component tape, such as tape 400. Additionally, the output module 300 may comprise a drive member 321. The drive member may be any structure operable to advance a component tape, such as tape 400, through an output module. For instance, the drive member 321 may be a gear like component having teeth configured to interact with holes 412 of a component tape 400 (shown in FIGS. 50-51). However, the drive member 321 may also be a roller like structure and may work in conjunction with another structural member to roll and advance a component tape 400. The output module 300 may be configured to remove a component tape received and advanced from any of a plurality of input modules, such as modules 100/150. Furthermore, the output module 300 may be configured to receive and advance a component tape, such as tape 400 in either a forward or reverse direction.

Figure 14:
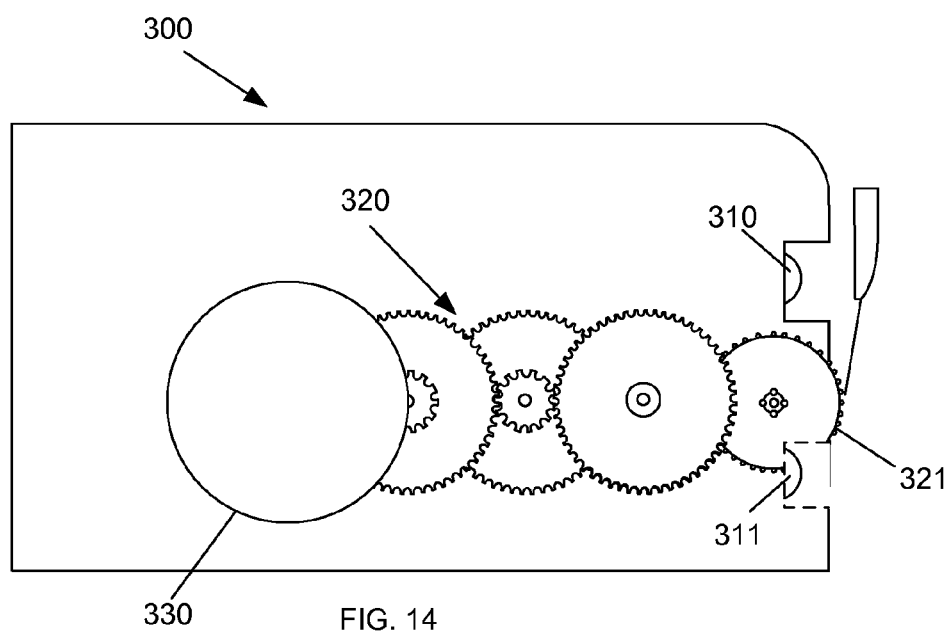
FIG. 14 depicts a side view of an embodiment of an output module having a portion of the cover cut-away to reveal internal components, in accordance with embodiments of the present invention.
Figure 15:
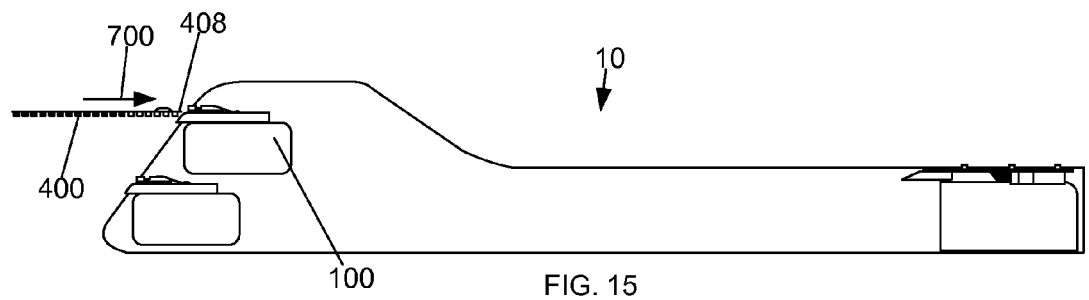
FIG. 15 depicts a side view of an embodiment of first component tape just prior to initial insertion into an embodiment of a first input module of an embodiment of a component tape feeder apparatus having a cover removed, in accordance with embodiments of the present invention.
Figure 19:
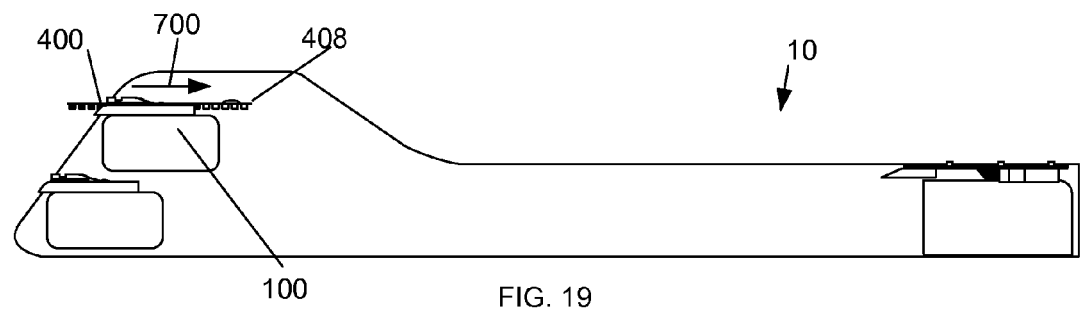
FIG. 19 depicts a side view of an embodiment of the first component tape following initial insertion into an embodiment of the first input module of an embodiment of a component tape feeder apparatus having a cover removed, in accordance with embodiments of the present invention.

Additional component elements of an output module 300 are depicted in FIG. 14, which shows a side view of an embodiment of the output module 300 having a portion of the cover 314 cut-away to reveal internal components such as a drive system 320 and a motor 330. The drive system 320 may be an arrangement of gears configured to transfer motive force generated by a motor 330 to the drive member 321. As shown in FIGS. 12-14, an output module 300 may include a tape sensor 310, which may be situated so as to be exposed to the presence of a component tape, such as tape 400. A tape sensor 310 may be oriented to readily detect the presence of a component tape during interaction with the output module 300. The tape sensor 310 may be communicatively coupled to various devices relative to component placement and printed circuit board assembly. Although only one drive member is shown, those in the art should realize that multiple drive members 321 may be included to help advance component tape.

With continued reference to the drawings, FIGS. 15-21 depict views of the insertion of a first component tape 400 into an embodiment of a first input module 100 of an embodiment of a component tape feeder apparatus 10. Accordingly, a component tape 400 may be maneuvered in a forward direction 700 toward at least one of a plurality of input modules, such as first input module 100, of a component tape feeder apparatus 10. A lead edge 408 or end of the first component tape may be inserted through an input, such as first input 15 shown in FIG. 1, of the feeder 10, so that when inserted the lead edge 408 is positioned within the tape slot 105 as oriented by guide unit 115 of first input module 100. The first component tape 400 may be inserted through the slot until prongs 113 contact the tape 400 to help hold it in correct position as drive member 121 engages the holes 412 of the first component tape 400. During insertion, the tape sensor 110 may detect the presence of the inserted and/or received tape 400 and may communicate said detected presences to other control/relay devices which may facilitate operation of the input module. For instance, when the sensor 110 detects a tape, such as tape 400, a corresponding signal may be sent to initiate drive member 121. The drive member 121 may engage the tape 400 and self thread the tape 400 through the first input module 100 and into the component tape feeder 100. As such, embodiments of a component tape feeder apparatus may employ self-actuated feeding based on detection of an inserted component tape 400. In other words, all a user/operator need do to feed a component tape 400 using a feeder 10 is to insert the end or lead edge 408 of the component tape 400 into at least one of a plurality of input modules, such as first input module 100, and then the input module 100 self feeds and threads the component tape 400 to advance the tape 400 the rest of the way into and/or through the feeder apparatus 10. Hence, the user/operator need not manually feed the tape 400 into and or through a substantial portion of the feeder 10.

Figure 22:
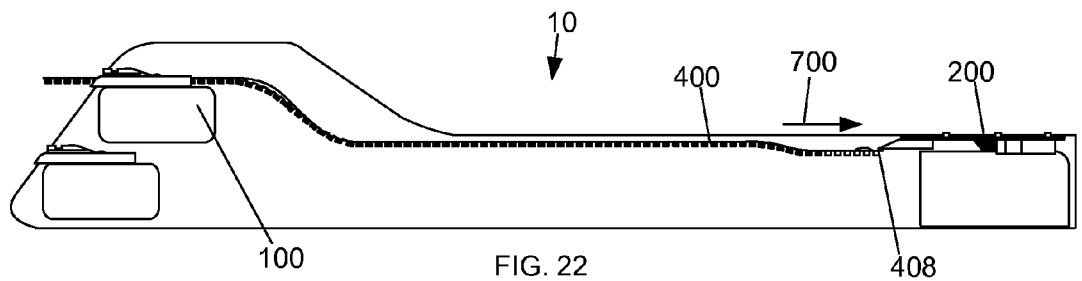
FIG. 22 depicts a side view of an embodiment of the first component tape after having been advanced from an embodiment of the a first input module to an embodiment of an exposure module of an embodiment of a component tape feeder apparatus having a cover removed, in accordance with embodiments of the present invention.
Figure 34:
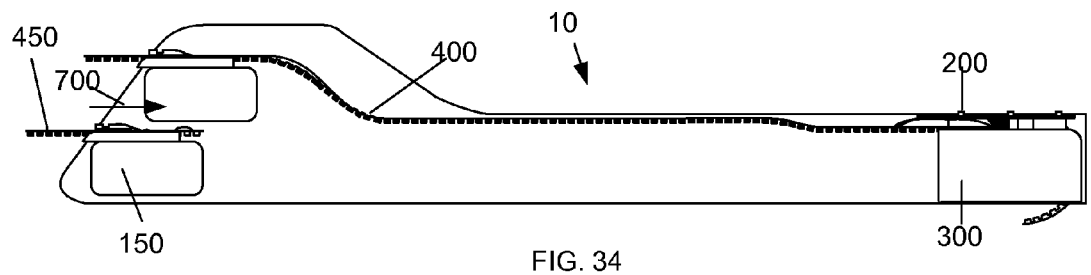
FIG. 34 depicts a side view of an embodiment of the first component tape being fed through an embodiment of a component tape feeder apparatus and outputted by an embodiment of an output module and also of an embodiment of the second component tape following initial insertion into an embodiment of the second input module of the component tape feeder apparatus having a cover removed, in accordance with embodiments of the present invention.
Figure 35:
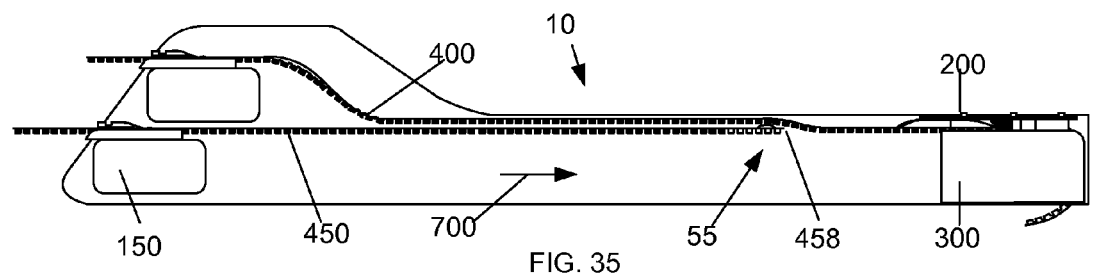
FIG. 35 depicts a side view of an embodiment of the first component tape being fed through an embodiment of a component tape feeder apparatus and outputted by an embodiment of an output module and also of an embodiment of the second component tape following advancement from an embodiment of the second input module of the component tape feeder apparatus having a cover removed, in accordance with embodiments of the present invention.
Figure 36:
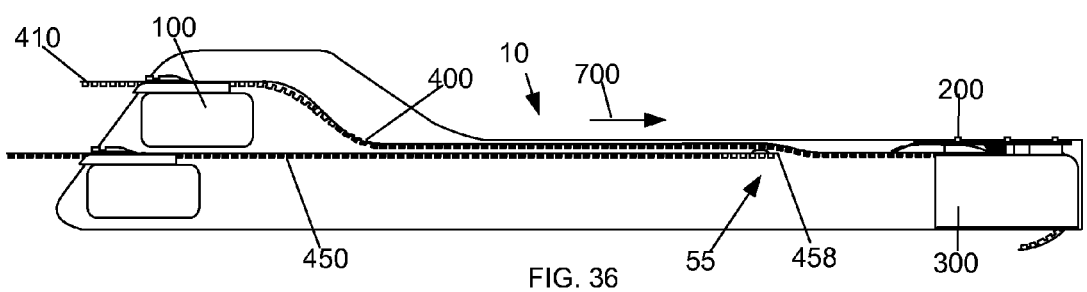
FIG. 36 depicts a side view of an embodiment of the advancing trailing end of the first component tape approaching an embodiment of the first input module and also of an embodiment of the second component tape following advancement from an embodiment of the second input module of an embodiment of a component tape feeder apparatus having a cover removed, in accordance with embodiments of the present invention.
Figure 37:
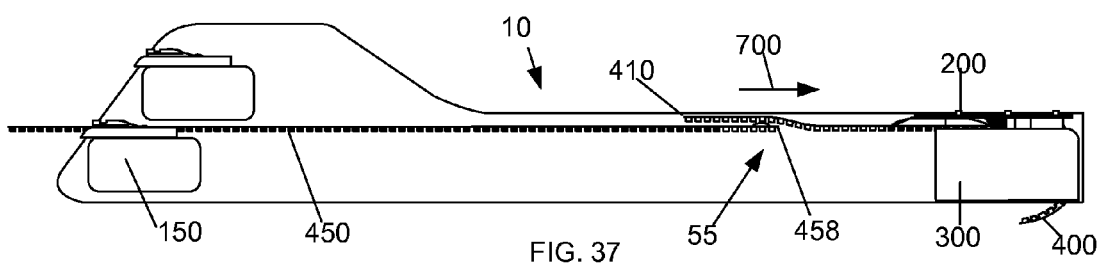
FIG. 37 depicts a side view of an embodiment of the advancing trailing end of the first component tape moving through an embodiment of a component tape feeder apparatus and also of the second component tape following its advancement from an embodiment of the second input module of the component tape feeder apparatus having a cover removed, in accordance with embodiments of the present invention.
Figure 38:
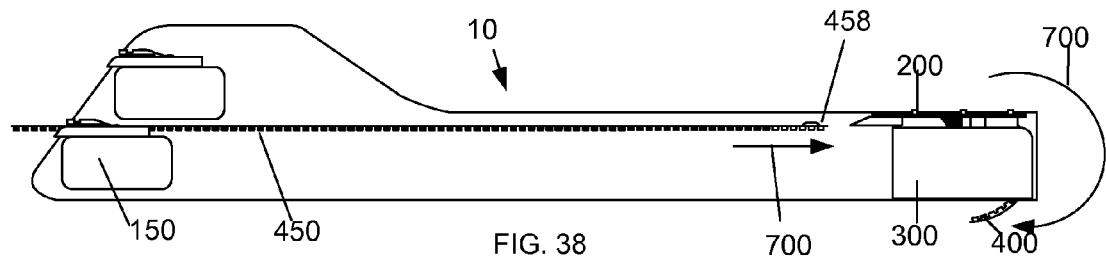
FIG. 38 depicts a side view of an embodiment of second component tape following advancement from an embodiment of the second input module and the outputting of an end of an the first component tape from an embodiment of an output module of an embodiment of a component tape feeder apparatus having a cover removed, in accordance with embodiments of the present invention.

With further reference to the drawings, FIGS. 22-24 depict the positioning of a first component tape 400 after having been self-advanced in a forward direction 700 from a first input module 100 by the first input module 100 to a position just prior to encounter with an embodiment of an exposure module 200 of a component tape feeder apparatus 10, wherein the leading edge 408 of the component tape 400 is near tape engagement element 220 of exposure module 200. Moreover, FIGS. 25-28 depicts views of an embodiment of the first component tape 400 during and following encounter, in a forward direction 700, with an embodiment of an exposure module 200, in accordance with embodiments of the present invention. Exposure module 200 may separate cover tape 405 from base tape 404 thereby exposing at least a component 12 in pocket 406 as exposed and revealed via pick port 210.

Once component 12 has been removed from component tape 400 by the component placement machine (not shown), first component tape 400 may transported out of feeder 10 by output module 300 to a scrap bin or a tape cutter (not shown). FIG. 29-32 depict views of the first component tape 400 encountering the output module 300 and illustrate how the first component tape 400 may be outputted following encounter with output module 300. For example, a lead edge 408 of component tape 400 may be detected by tape sensor 310 of output module 300 as the tape 400 is advanced by input module 100. Once detected, the drive member 321 of output module 300 may be activated to engage holes 412 of first component tape 400 as it is maneuvered through component tape feeder apparatus 10. The location of the output module within the feeder 10 may help facilitate accurate and operable positioning of the component tape 400 as it is advanced and outputted by output module 300.

An advantage afforded by the present invention is that while components 12 associated with one component tape, such as first component tape 400, are being fed and supplied to a component placement machine via operation of a component tape feeder apparatus 10, differing components 13 associated with another component tape, such as a second component tape 450, may be simultaneously loaded into the component tape feeder apparatus 10 and readied for delivery to the component placement machine. The plurality of input modules of feeder 10 can be operated concurrently, wherein each input module, such as modules 100 and 150, may function to receive and advance different component tapes 400 and 450 having different components 12 and 13. Turning again to the drawings, FIGS. 33-38, inter alia, depict structural configuration related to plural operability of at least two input modules 100 and 150 of a component tape feeder apparatus 10, wherein the at least two input modules 100 and 150 are each operably connected to a single exposure module 200 which is in turn operably connected to a single output module 300 of a component tape feeder apparatus 10.

While a first component tape 400 is being fed through a component tape feeder apparatus 10 and outputted by an output module 300, a second component tape 450 may be maneuvered to a location just prior to a point of initial insertion into an input 17 (see FIG. 1) of a second input module 150 of the component tape feeder apparatus 10. Such maneuvering may be effected manually by a user/operator simply moving a leading edge 458 of an end of a second component tape 450 into close proximity with the input 17 of second input module 150. However, maneuvering of component tapes, such as first component tape 400 or second component tape 450, into operable position for insertion into any one of the plurality of input modules, such as input modules 100 and/or 150, may be effected by an automated process involving one or several devices.

Following initial insertion of the second component tape 450 into the second input module 150, a leading edge 458 the second component tape 450 may be advanced from the second input module 100 in a forward direction 700 to a stop position 55 within the component tape feeder apparatus 10 while a trailing edge 410 of the first component tape 400 advances in a forward direction 700 toward and/or through the component tape feeder apparatus until the first component tape 400 is completely fed through or entirely outputted by output module 300. The second component tape 450 may be advanced from stop position 55 toward the exposure module 200 once the first component tape 400 is no longer positioned in the space between the stop position 55 and the exposure module 200.

Figure 39:
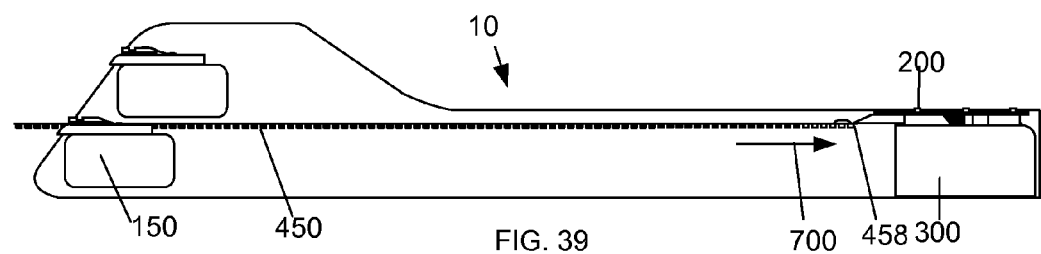
FIG. 39 depicts a side view of an embodiment of the second component tape after having been advanced from an embodiment of the second input module to an embodiment of an exposure module following complete output of the first component tape (shown in FIG. 38) of an embodiment of a component tape feeder apparatus having a cover removed, in accordance with embodiments of the present invention.
Figure 40:
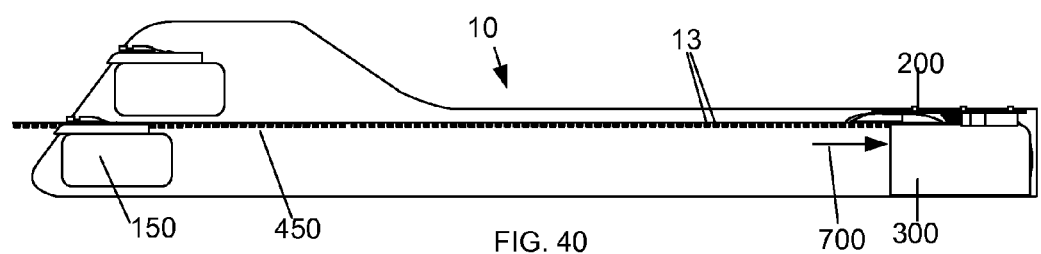
FIG. 40 depicts a side view of an embodiment of the second component tape following encounter with an embodiment of an exposure module of an embodiment of a component tape feeder apparatus having a cover removed, in accordance with embodiments of the present invention.
Figure 41:
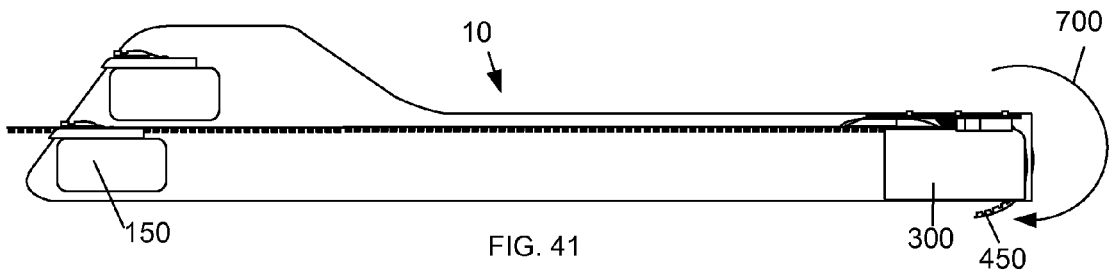
FIG. 41 depicts a side view of an embodiment of the second component tape being outputted following encounter with an embodiment of an output module of an embodiment of a component tape feeder apparatus having a cover removed, in accordance with embodiments of the present invention.

With the first component tape 400 advanced out of output module 300 of the component tape feeder apparatus 10, as shown in FIG. 39, the second component tape 450, after having been advanced from the second input module 150 may proceed to encounter the exposure module 200, as shown in FIG. 40, so that the component tape 450 may be prepared for extraction of components 13 through exposure module 200. Accordingly, when component 13 extraction is properly effectuated then the empty second component tape 450 may be outputted in a forward direction by output module 300, as shown in FIG. 41. Those in the art should recognize that the feeding of a component tape, such as component tape 400 or 450, may be conjunctively effectuated by both an input module 100 or 150, of the plurality of input modules, with the output module 300.

Figure 42:
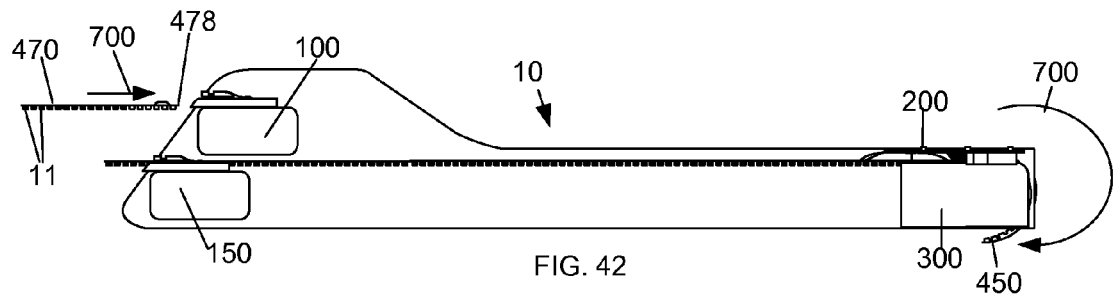
FIG. 42 depicts a side view of an embodiment of the second component tape being fed through an embodiment of a component tape feeder apparatus and outputted by an embodiment of an output module and also of an embodiment of a third component tape just prior to initial insertion into an embodiment of the first input module of the component tape feeder apparatus having a cover removed, in accordance with embodiments of the present invention.
Figure 43:
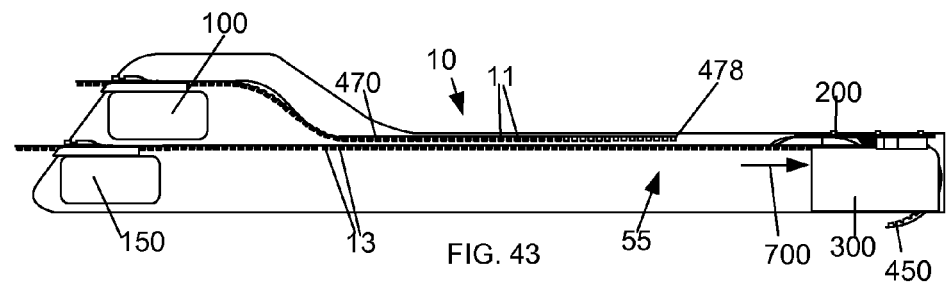
FIG. 43 depicts a side view of an embodiment of the second component tape being fed through an embodiment of a component tape feeder apparatus and outputted by an embodiment of an output module and also of an embodiment of the third component tape following advancement from an embodiment of the first input module of the component tape feeder apparatus having a cover removed, in accordance with embodiments of the present invention.

Because the component tape feeder apparatus 10 includes multiple input modules, it is possible to continuously swap component types with only short interruptions of component supply. For example, while a second component tape 450 is being fed in a forward direction 700 through the component tape feeder apparatus 10 and outputted by the output module 300, a third component tape 470 having different components 11, as shown in FIG. 42, may be maneuvered to a position proximate an input 15 (shown in FIG. 1) of first input module 100 just prior to initial insertion of the different component tape 470 into the first input module 100. Following insertion, a leading edge 478 of the third component tape may be advanced from the first input module to a stop position 55 within the component tape feeder apparatus 10. The third component tape 470 may remain at the stop position 55 in preparation for component 11 supply to a component placement machine until it is no longer necessary to supply components 13 of the second component tape 450 or until the second component tape 450 has completely advanced through the component tape feeder apparatus 10 and been outputted by the output module 300.

Figure 44:
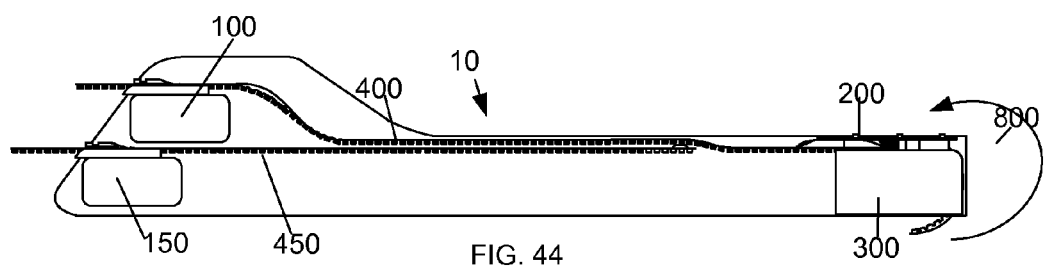
FIG. 44 depicts a side view of an embodiment of a first component tape being fed in a reverse direction through an embodiment of an output module and an embodiment of a first input module of an embodiment of a component tape feeder apparatus and also of an embodiment of a second component tape following forward advancement from an embodiment of a second input module of the component tape feeder apparatus having a cover removed, in accordance with embodiments of the present invention.
Figure 45:
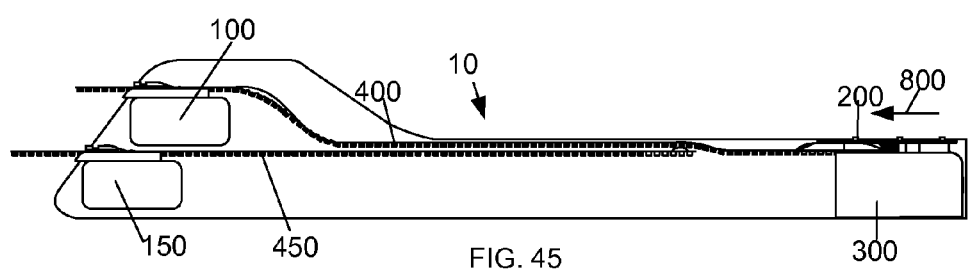
FIG. 45 depicts a side view of an embodiment of a first component tape being fed in a reverse direction past an embodiment of an exposure module and through an embodiment of a first input module of an embodiment of a component tape feeder apparatus and also of an embodiment of a second component tape following forward advancement from an embodiment of a second input module of the component tape feeder apparatus having a cover removed, in accordance with embodiments of the present invention.
Figure 46:
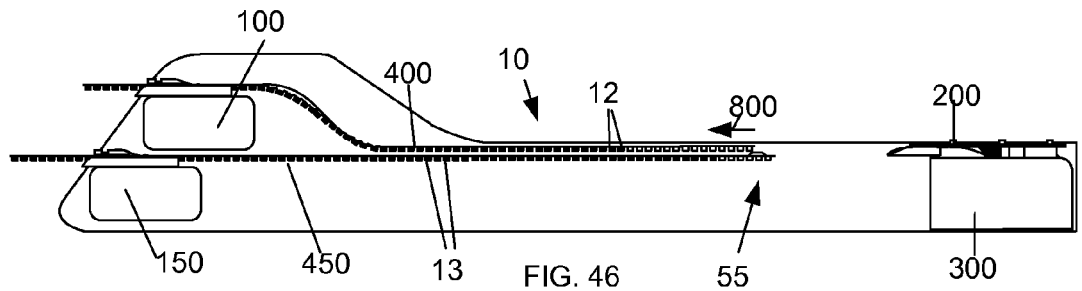
FIG. 46 depicts a side view of an embodiment of a first component tape being fed in a reverse direction past a leading edge of an embodiment of a second component tape following forward advancement of the second component tape from an embodiment of a second input module and wherein the first component tape is also reverse fed through an embodiment of a first input module of an embodiment of a component tape feeder apparatus having a cover removed, in accordance with embodiments of the present invention.
Figure 47:
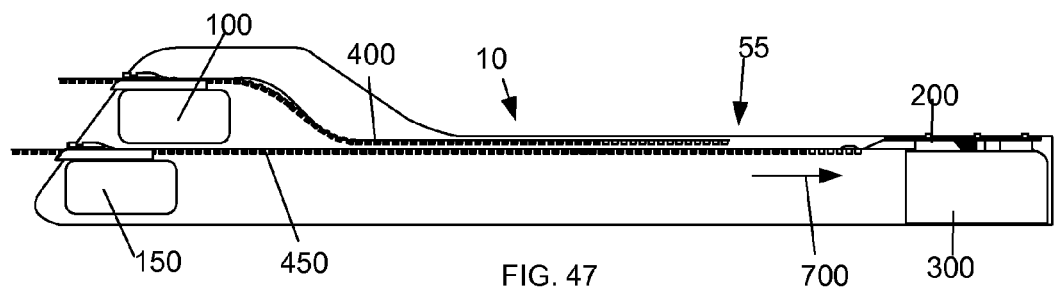
FIG. 47 depicts a side view of an embodiment of the second component tape being fed through an embodiment of a component tape feeder apparatus and just prior to encounter with an embodiment of an exposure module of the component tape feeder apparatus and also of an embodiment of the first component tape following reverse advancement by an embodiment of the first input module of the component tape feeder apparatus having a cover removed, in accordance with embodiments of the present invention.

Once a component tape, such as first component tape 400, has been inputted into a component tape feeder apparatus 10, it is not necessary to advance the inputted first component tape 400 in a forward direction until all the components 12 have been extracted from the tape 400 and the tape has been completely outputted by output module 300. Rather, a component tape, such as tape 400, may be retracted or advanced in a reverse direction 800, as shown in FIG. 44. Moreover, the reverse advancement 800 of first component tape 400 may occur simultaneously with and at the same time as forward advancement 700 of the second component tape 450 from the second input module 150 of the component tape feeder apparatus 10. Those in the art should also recognize that reverse advancement 800 of one component tape, such as first component tape 400, may also occur when another component tape, such as second component tape 450, is stopped within the component tape feeder apparatus 10 or when there is no other component tape positioned within the component tape feeder apparatus 10 at all. Where it is desirable to retract a first component tape 400 so that a second component tape 450 may be fed to supply components 13 to a component placement machine, the first component tape may be retracted by operation of either or both the output module 300 and/or the associated input module 100/150 as long as the tape can be in contact with a drive member 321/121 of the output or input module 300/100/150 during retraction. As such, both the output module 300 and any one of the plurality of input modules may work in conjunction to retract the applicable component tape. For example, when the first component tape 400 is retracted back past the output module 300, as in FIGS. 45-46, only the input module, such as first input module 100, operatively associated with the component tape being retracted, such as first component tape 400, may drive reverse advancement 800 of the first component tape. The first component tape 400 needs to be retracted to at least a position, such as stop position 55, where the first component tape 400 will not hinder forward advancement 700 of the second component tape 450 by the second input module 150, as shown in FIG. 47. Those in the art should also appreciate that the first component tape 400 may also be completely retracted from the component tape feeder apparatus 10, thereby affording the possibility of loading another different component tape, such as a third component tape 470, into the first input module 100.

To facilitate easier retraction of component tape 400 to either stop position 55, completely out of feeder apparatus 10, or to some other position within feeder apparatus 10, a cutter (not shown) may be mounted contiguous or within feeder apparatus 10. The cutter may segment portions of component tape 400 when being forwarded by output module 300 thereby reducing the length of tape that may need to be retracted.

Figure 48:
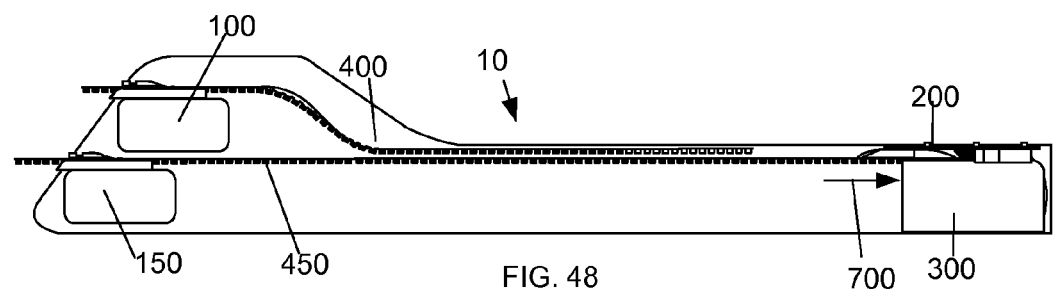
FIG. 48 depicts a side view of an embodiment of the second component tape being fed through an embodiment of a component tape feeder apparatus and just prior to its encounter with an embodiment of an exposure module of the component tape feeder apparatus and also of an embodiment of the first component tape following reverse advancement by an embodiment of the first input module of the component tape feeder apparatus having a cover removed, in accordance with embodiments of the present invention.
Figure 49:
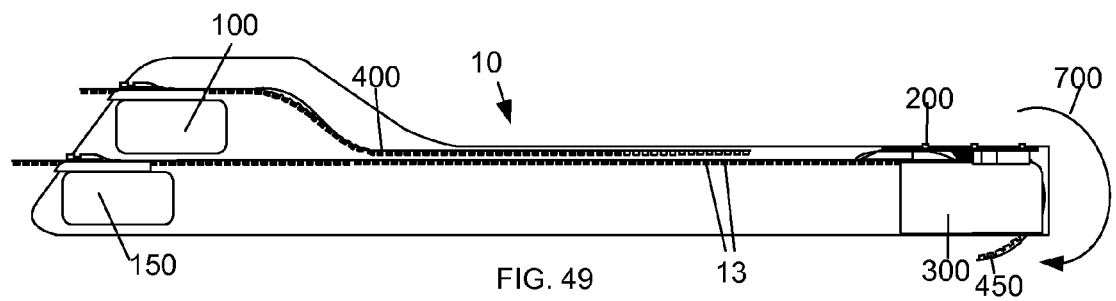
FIG. 49 depicts a side view of an embodiment of the second component tape being fed through an embodiment of a component tape feeder apparatus and outputted by an embodiment of an output module of the component tape feeder apparatus and also of an embodiment of the first component tape following reverse advancement by an embodiment of the first input module of the component tape feeder apparatus having a cover removed, in accordance with embodiments of the present invention.

Once the first component tape 400 has been sufficiently retracted, then another component tape, such as second component tape 450, associated with one of a plurality of input modules, such as second input module 150, may be fed in a forward direction 700 through the component tape feeder apparatus 10, as shown in FIGS. 48-49, until it encounters the exposure module 200 in preparation for extraction of components 13 prior to outputting of the second component tape 450 by output module 300. Once components 13 have been removed from second component tape 450 by the component placement machine (not shown), second component tape 450 may be transported out of feeder 10 by output module 300 to a scrap bin (not shown). Upon exiting output module 300, component tape 450 may be segmented by a cutter (not shown) into small lengths for easier removal from the scrap bin. The cutter may be housed either within feeder 10 or the scrap bin, may be positioned contiguous to feeder 10 or the scrap bin, or may be located along a path from feeder 10 to the scrap bin.

As discussed above in relation to FIGS. 1-51, methods of feeding electronic components, such as electronic components 12, to a component placement machine for assembly on printed circuit boards may include providing a component tape feeder 10 having a plurality of input modules, such as input modules 100 and 150. Each input module, such as modules 100 and 150, of the plurality of input modules may be operably connected to a single component exposure module 200. The single component exposure module 200 may be operably connected to a single output module 300.

Further methodology for feeding electronic components to a component placement machine for assembly on printed circuit boards may also include supplying a plurality of component tapes, such as first and second component tapes 400 and 450, housing electronic components, such as electronic components 12 and 13, to the single exposure module 200. In addition, supplying the plurality of component tapes to the single exposure module 200 may further involve receiving and forwarding any one of the plurality of component tapes, such as first and second component tapes 400 and 450, by the plurality of input modules, such as input modules 100 and 150.

Once the electronic components, such as components 12 and/or 13, have been supplied to the single exposure module, further methodology for feeding electronic components to a component placement machine for assembly on printed circuit boards may also include extracting said electronic components, such as components 12 and/or 13, housed by said plurality of component tapes, such as tapes 400 and/or 450, through said single exposure module. Those in of ordinary skill should appreciate that component extraction may be effectuate by a pick and place mechanism functionally known by those in the art.

When the requisite components have been extracted from the component tapes, one further methodological step may include outputting any of the plurality of component tapes, such as tapes 400 and/or 450 from the component tape feeder 10 by a single output module 300. Moreover, methodology may include retracting a certain component tape and then forward advancing another component tape operably positioned within the component tape feeder apparatus 10.

Although the term module has been used to describe various elements of feeder apparatus 10, and such modules have been described as being replaceable in that the various individual modules may of themselves be removed and replaced by another comparable module, those in the art should recognize that component features described, inter alia, as modules may also be fully incorporated areas of feeder 10. For example, the elemental features of input modules 100 and 150, exposure module 200, and output module 300 may be operably integrated into the feeder 10, being connected to, and operably positioned integrated within the body 14. It should, therefore be appreciated that module elements may be built into and become integral with the feeder apparatus 10 as a whole. As such, the sensors described in association with the modules may be placed in either in the same location as if within a module or the sensors may be situated in other parts of feeder apparatus 10 along the travel path of component tape 400 to provide the same functionality.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention.

We claim:

1. A method of feeding electronic components, said method comprising:
   providing a component tape feeder, said feeder including a plurality of input modules, wherein each input module of said plurality of input modules is operably connected to a single component exposure module, and further wherein said single component exposure module is operably connected to a single output module;
   supplying a plurality of component tapes housing electronic components to said single exposure module, wherein said supplying involves receiving and forwarding of said plurality of component tapes by said plurality of input modules;
   extracting said electronic components housed by said plurality of component tapes through said single exposure module; and,
   outputting said plurality of component tapes from said component tape feeder by a single output module.

2. The method of feeding electronic components of claim 1, wherein the plurality of input modules are operated concurrently, such that each input module functions to receive and advance a different component tape having different electrical components.

3. The method of feeding electronic components of claim 1, wherein the plurality of input modules are operated concurrently, such that each input module functions to receive and advance a different component tape having same electrical components.

4. The method of feeding electronic components of claim 1, wherein one component tape of said plurality of component tapes is moved in a forward direction within the feeder while another component tape of said plurality of component tapes is simultaneously moved in a reverse direction within the feeder.

5. The method of feeding electronic components of claim 1, further comprising providing at least one tape sensor operable within said feeder.

6. The method of feeding electronic components of claim 5, wherein said at least one tape sensor detects the presence of the received tape and communicates said detected presence to other devices which facilitate the advancement of the received tape within said component tape feeder.

* * * * *